United States Patent [19]

Matcovich et al.

[11] 4,315,128

[45] Feb. 9, 1982

[54] ELECTRICALLY HEATED BONDING TOOL FOR THE MANUFACTURE OF SEMICONDUCTOR DEVICES

[75] Inventors: Thomas J. Matcovich, Maple Glen; Dan Valenski, Hatboro, both of Pa.

[73] Assignee: Kulicke and Soffa Industries Inc., Horsham, Pa.

[21] Appl. No.: 894,344

[22] Filed: Apr. 7, 1978

[51] Int. Cl.³ .......................... B23K 3/00; H05B 3/16
[52] U.S. Cl. .............................. 219/85 D; 219/85 F; 219/229; 219/230; 219/233; 219/541; 219/543; 228/1 A; 228/4.5; 228/44.1 A; 228/179
[58] Field of Search ...................... 219/221, 227-241, 219/543, 85 D, 85 F, 541, 216; 228/179, 180, 180 A, 4.5, 44.1 R, 44.1 A, 1 R, 1 A; 338/308, 309, 306

[56] References Cited

U.S. PATENT DOCUMENTS

| | | | |
|---|---|---|---|
| 2,859,321 | 11/1958 | Garaway | 219/543 X |
| 3,007,026 | 10/1961 | Woodling | 219/543 X |
| 3,136,878 | 6/1964 | Staller | 228/54 |
| 3,271,555 | 9/1966 | Hirshon et al. | 219/85 D |
| 3,320,401 | 5/1967 | Zachry et al. | 219/85 F |
| 3,358,897 | 12/1967 | Christensen | 228/40 |
| 3,384,283 | 5/1968 | Mims | 228/1 |
| 3,478,191 | 11/1969 | Johnson et al. | 219/543 X |
| 3,569,665 | 3/1971 | Hager | 219/227 X |
| 3,576,969 | 5/1971 | Surty et al. | 219/237 X |
| 3,617,682 | 11/1971 | Hall | 219/85 F |
| 3,641,304 | 2/1972 | Angelucci | 219/85 D |
| 3,699,588 | 10/1972 | Eck et al. | 219/543 X |
| 3,811,030 | 5/1974 | Veach | 219/237 |
| 3,838,240 | 9/1974 | Schelhorn | 219/230 X |
| 3,920,949 | 11/1975 | Clawson et al. | 219/85 F |

FOREIGN PATENT DOCUMENTS 1338159 11/1973 United Kingdom .............. 219/85 D

*Primary Examiner*—A. Bartis
*Attorney, Agent, or Firm*—John B. Sowell

[57] ABSTRACT

A heated bonding tool for the manufacture of semiconductor devices comprises a high density non-porous alumina body having a mounting portion at one end and a working portion at the other end. The working portion end is tapered and converges toward the working tip portion. An electrically conductive-resistive thick film is deposited over the outer surface of the tapered portion intermediate said mounting portion and said working tip portion which is capable of heating said working tip of said bonding tool up to 600° C. Preferably the thick film material has a positive or negative temperature coefficient of resistance which permits the temperature of the working tip to be monitored as a function of the measured resistance of the thick film. An insulative heat resistant terminal block is provided with a pair of resilient leads connected to a power source. Cam means on the terminal block are adapted to move the resilient leads to permit release of the leads from engagement with thick film conductive leads deposited on the mounting portion of the bonding tool.

11 Claims, 12 Drawing Figures

ELECTRICALLY HEATED BONDING TOOL FOR THE MANUFACTURE OF SEMICONDUCTOR DEVICES

CROSS-REFERENCES

This invention is an improvement in bonding tools of the type disclosed in U.S. Pat. No. 3,641,304 and patents cited therein.

BACKGROUND OF THE INVENTION

1. Field of the Invention This invention relates to heating elements for semiconductor bonding tools. More particularly the invention relates to a novel heating element which comprises a conductive-resistive film applied directly to bonding tools of the prior art type.

2. Description of the Prior Art

Wire bonding and die bonding tools are well known in the prior art. It is also known that heating these bonding tools during certain types of bonding operations produces better bonds which are completed faster. The heating elements for such prior art bonding tools generally fall into one of two types. Either the tool holder has a heating element embodied therein or the heating element was attached to the bonding tool proper. Heretofore, cartridge type heaters and wound wire heaters had to be large in comparison to the size of the bonding tool because the heat was transmitted through one or more air to heater surfaces. Attempts to silver solder or attach the prior art heaters to the binding tool or bonding tool holder did not succeed because premature failure of the heating element rendered the expensive bonding tool or holder inoperable thus requiring expensive rework.

Prior art heating elements for bonding tools required a substantial amount of heat because the heating elements and/or heat sink tool holders have large areas for heat dissipation. Also, the temperature of the tool holder approaches the temperature of the heating elements.

Cartridge and wire wound heaters generate their heat at a point which is remote from the working tip of the bonding tool. This requires that the heater not only supply additional heat which is dissipated, but that the heater be operated at a substantially higher temperature to overcome the temperature gradient between the heater and the working tip.

Heretofore, it was known that resistor materials could be deposited on dielectric substrates. Such prior art resistors have been made by depositing special paste through slots or silk screens, by evaporating deposits, by sputtering deposits or electroplating deposits. Prior art deposited resistors are designed to hold their ohmic resistance over a narrow range of temperatures, usually 40° C. to 50° C. In order to maintain desired temperature stability, such resistors are provided with large areas for heat dissipation. Such resistors may provide up to one square inch of surface for each watt of heat generated.

Bonding tools are known in the prior art which are heated by passing electrical current through the tool. These resistance type bonding tools were generally used to heat metal capilliaries or to bond preformed electrical leads or wires to terminal pads on a foil pattern or a substrate. Such tools may be employed on electrodes or pads on a semiconductor device if care is taken to avoid damage to the semiconductor device proper.

Prior art heating devices were large and often obstructed part of the view of the workpiece when the bonding tool was in or approaching the working position. The large mass of the prior art heating elements required larger structural machine parts and drives or alternatively resulted in slower operation of the bonding machines than could be obtained without heaters.

It would be desirable to retain all of the advantages of presently know bonding tools and heated bonding tools without incurring the disadvantages of having to employ prior art heating devices.

SUMMARY OF THE INVENTION

It is a primary object of the present invention to provide a novel heating element which is permanently attached to a bonding tool.

It is another primary object of the present invention to provide a heating element which is economical to manufacture, extremely reliable and has a useful lifetime in excess of the bonding tool to which it is attached.

It is another object of the present invention to provide a heating element for a bonding tool which has negligible size and mass.

It is yet another object of the present invention to provide a novel thick film heating element which requires a very small amount of power to produce extremely high temperatures.

It is another object of the present invention to provide a thick film heating element which changes resistance with a change of temperaure in the heating range of the bonding tool so as to permit monitoring the resistance as an indication of the temperature of the bonding tool.

It is another object of the present invention to provide a novel heating element which may be applied to electrically conductive bonding tools without introducing current into the device being bonded.

It is yet another object of the present invention to provide novel means for applying current to a bonding tool heating element.

In accordance with these and other objects of the present invention there is provided a bonding tool of the prior art type having an electrically conductive resistive film deposited thereon at or near the working tip. The characteristics of the electrically conductive-resistive film are controlled to provide a very high temperature over a small area with a small amount of power. The film is applied as a thin layer or layers so that the increase in size and mass of the bonding tool is negligible. Conductive paths may be deposited on the bonding tool which cooperate with flexible power leads, thus, enabling the bonding tools to be easily interchanged.

DESCRIPTION OF THE PREFERRED EMBODIMENT

Figure 1:
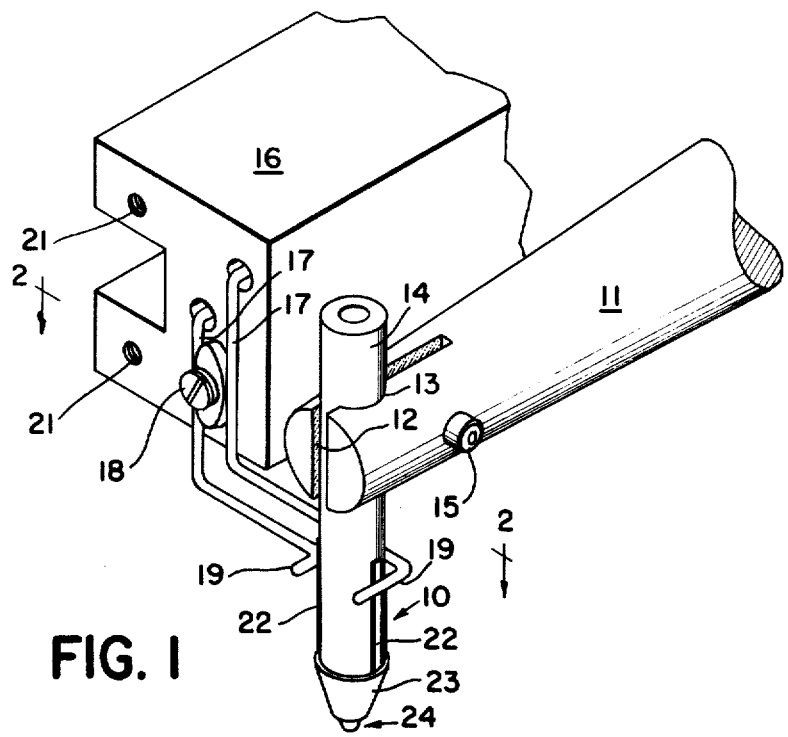
FIG. 1 is an isometric view of a heated bonding tool in a bonding tool holder showing a preferred flexible power lead structure.
Figure 2:
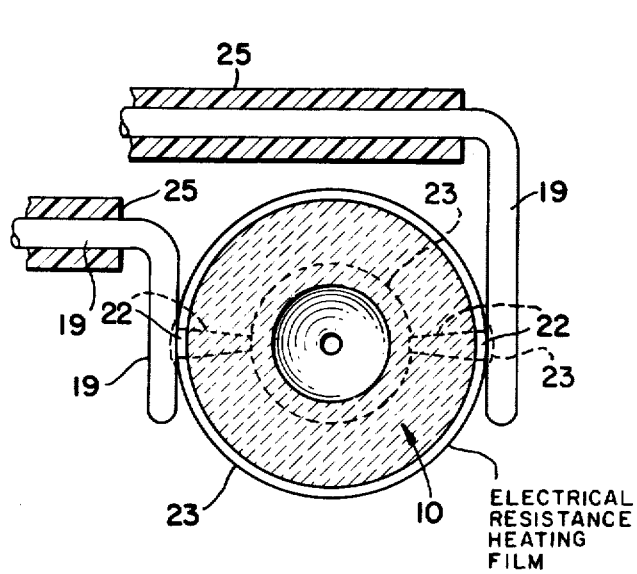
FIG. 2 is an enlarged section in plan view taken at lines 2—2 of FIG. 1.
Figure 3:
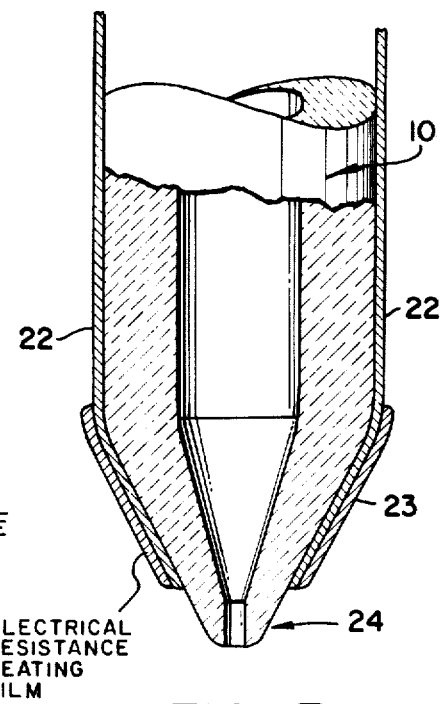
FIG. 3 is an enlarged partial section in elevation of the bonding tool of FIGS. 1 and 2.

Refer now to FIGS. 1 to 3 showing a preferred embodiment of the present invention. Bonding tool 10 is shown mounted in an ultrasonic tranducer horn 11. The end of the transducer is split at slot 12 and is provided with a cylindrical recess 13 adapted to receive the upper or mounting portion 14 of bonding tool 10. Tool 10 is firmly held in recess 13 by clamp screw 15.

Terminal mounting block 16 is supported on the bonding machine (not shown) adjacent to transducer horn 11. A pair of flexible leads 17 are connected at their upper ends to a source of electrical power (not shown). The upper horizontal ends of the flexible leads 17 are preferably shaped to form a rigid fixed connection with the connector (not shown) in the terminal mounting block 16 which is made of insulating material. The vertical portions of leads 17 extend down the face of mounting block 16 on either side of a cam screw 18 which is pivotably mounted in block 16. When the insulated cam screw 18 is rotated 180 degrees, the vertical portions of leads 17 are forced apart which also forces the lower horizontal end portions 19 apart. In the preferred embodiment, leads 17 are made of resilient material and are normally spring biased to engage the sides of the bonding tool 10. It will be understood that the bonding tool 10 may be replaced more quickly and easily when flexible leads 17 are not engaging the sides of the tool 10. Threaded recesses 21 are provided in mounting block 16 for attaching a cover plate (not shown) over the leads 17.

The preferred embodiment bonding tool is made of dense alumina (over 99% density). The alumina shank or nib is commercially available and has a high dielectric strength. Alumina substrates, used for miniaturized circuits or supports for integrated circuits, have lower density which provides greater porosity than the porosity of bonding tool 10.

For purposes of this invention the term "high density non-porous alumina" shall mean dense, pure alumina having a density greater than 99 percent. Presently, alumina is obtainable in densities about 99.5 percent. High density alumina has a non-porous glass-like surface finish and is easily distinguished from alumina used for substrates and integrated circuits which require porous surfaces to enable the circuit elements to lock into the porous surfaces.

Contact terminal pads 22 are deposited on tool 10 to provide elongated electrically conductive pads. Such pads may be deposited by evaporating, sputtering, electrodepositing, etc. the conductive material. The preferred technique is believed to be an application of gold paste such as those paste made by Engelhard Minerals and Chemical Company for line printing through metal mask or silk screening. Paths five mils wide and up to one mil thick may be applied with known techniques for applying paste. However, it was determined that such paste may also be applied by wooden spatulas or applied with thick ink applying tools. It was determined that fritless gold conductive compositions provided better bonding characteristics when applied to high density alumina. The pads 22 are set by heating and/or firing the applied paste. It should be noted that the film 23 or gold pads on the film 23 and could also serve as the conductive pads.

A conical shaped layer of electrically conductive-resistive material 23 is then applied over the working tip 24 of bonding tool 10. While the material can be deposited by known sputtering, evaporating and electroplating techniques, it is believed that an application of thick resistive composition paste such as those made by Engelhard Minerals and Chemical Company are preferred. Such thick paste are prepared for application by silk screening and printing through slots and may be easily applied in thicknesses of up to one mil in a single operation. Greater thicknesses may be achieved by setting and/or firing a first layer and then applying a second layer to build up the film 23. Thick films are distinguishable from thin films having a thickness of only 500 Å to about 10,000 Å. Thick films are generally acknowledged to be from 0.0005 inches (125,000 Å) to about 0.0015 inches (375,000 Å) thick It was determined that thick films applied as paste compositions could be deposited on the tapered working portion 24 to provide the conductive-resistive heating elements without further extension on the bonding tool. Such deposited films 23 have a normal working resistance in the range of 5 to 20 ohms between the conductive pads 22. It was further determined that maximum working temperatures could be obtained with about one-half watt of power. When one-half watt of power is generated by a 15 ohm heater film, the required applied voltage is only 2.74 volts. A 5 ohm heater film only requires 1.8 volts for operation. Stable temperatures in the range of 600° C. have been achieved with the above described heating elements.

Since silicon-aluminum eutectics form at 540° C. to 560° C., temperatures in excess of 600° C. will tend to destroy most semiconductor devices. It is believed that temperatures in excess of 600° C. are not presently required, however, should the state of the semiconductor art chaange to require higher temperatures, there are pastes which are capable of obtaining the higher temperatures.

Electrical current applied at terminal block 16 is conducted via leads 17 to terminal pads 22 of bonding tool 10. The current is directed into the electrically conductive-resistive film 23 and splits into two parallel paths between the conductive pads 22. Flexible lead 19, having insulative sleeves 25 thereon, are best shown in FIG. 2 in spring bias engagement with pads 22. When the ultrasonic tool holder 11 is active the leads 19 tend to follow the vibrating tool 10, but do not tend to damp the energy being applied to the bonding tool 10. While an ultrasonic wire bonding tool 10 is shown in FIG. 1, other shapes of tool holders may be employed. When other shapes of tool holders are employed often other shapes of working tips and working tools are employed.

A distinct advantage of the present heated bonding tool resides in its inherent ability to provide an indication of the temperature of the tip 24 of the bonding tool.

Resistive composition paste may be manufactured in a wide range of resistances which vary from 10 ohms per square to ten to the sixth ($10^6$) ohms per square. Ohms per square is herein defined as the resistivity $\rho$ divided by the thickness t where the length l and the width w of the square area under test are equal.

When a conductive-resistive film having a high thermal coefficient of resistance is employed, small changes in working temperatures result in measurable changes in resistance. Resistive paste are available with high negative temperature coefficients and moderately high positive temperature coefficients. Automatic welding controllers are known which are capable of monitoring the resistance between the electrodes of a spot welder. Accordingly, the monitor presently employed does not require detailed explanation for description of this invention. A temperature monitor which monitors change of voltage preferably maintains constant current. A temperature monitor which monitors change of current preferably maintains constant voltage. In the present invention an A.C. or D.C. power source may be applied to the conductive pads 22 of bonding tool 10 and the resistance monitored by observing either voltage or current changes to indicate the actual temperature of the working tip 24. It will be understood that initially the bonding tool is calibrated to determine the resistance versus temperature characteristic.

Figure 4:
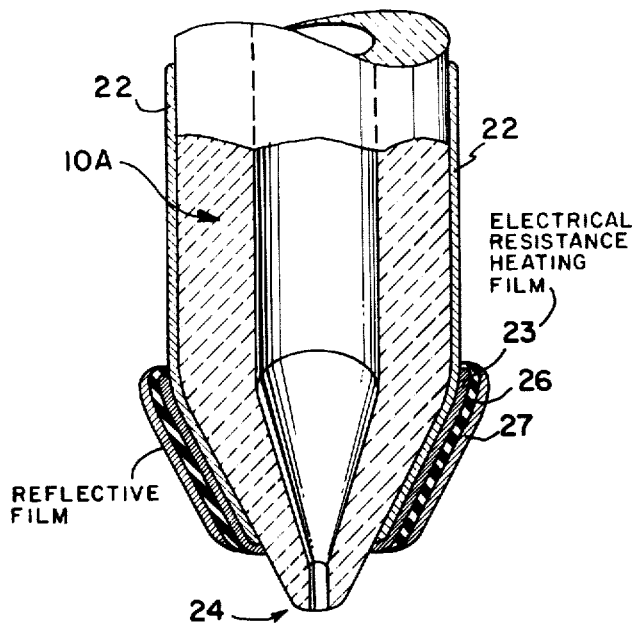
FIG. 4 is a partial section in elevation of a modified embodiment bonding tool.

FIG. 4 shows a modification of the bonding tool of FIG. 3. The conductive-resistive film 23 and terminal pads 22 remain as described with respect to FIG. 3. An insulating layer or coating 26 is applied over the film 23 to electrically isolate it. Thick film dielectric materials such as silicon dioxide or an equivalent are acceptable because only low voltages are employed on the bonding tools. A highly reflective layer 27 having a low coefficient of emissivity is applied an an outer coating over the insulating layer 26. The layer 27 may be electrically conductive. Even though the reflective layer may change its coefficient of emissivity slightly when operated at or near 600° C., it will retain most of its low coefficient emissivity so as to reduce radiated heat loss. A thin layer of auminum oxide 1,000 Å or more in thickness will be sufficient to form a reflective layer 27. In some embodiments of the present invention it may be desirable to add only the insulative layer 26 to the bonding tool 10A, because at low operating temperatures the radiated heat loss is of little significance.

Figure 5:
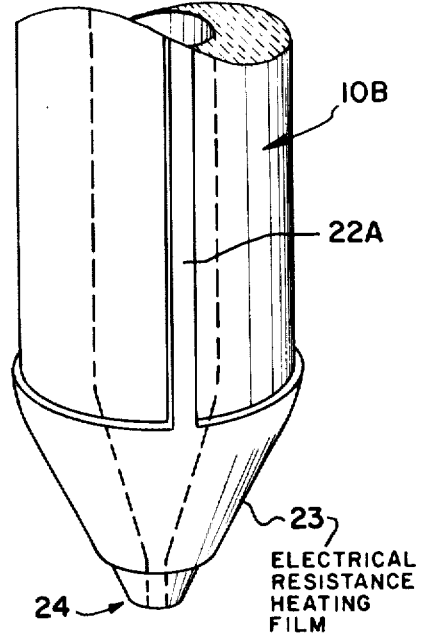
FIG. 5 is an elevation of a portion of another modified embodiment bonding tool.

FIG. 5 shows an alternative embodiment to the bonding tools of FIGS. 1 to 4. The base ceramic nib or caapilliary of bonding tool 10B is highly insulative. In certain environments it may be desirable to deposit both the conductive-resistive film 23 and the terminal pads 22A as a single layer of the same material. Even though the voltage gradient across the terminal pads 22A will not be uniform, sufficient heat can be generated in the working tip of the bonding tool to merit the use of this simplified embodiment.

Figure 6:
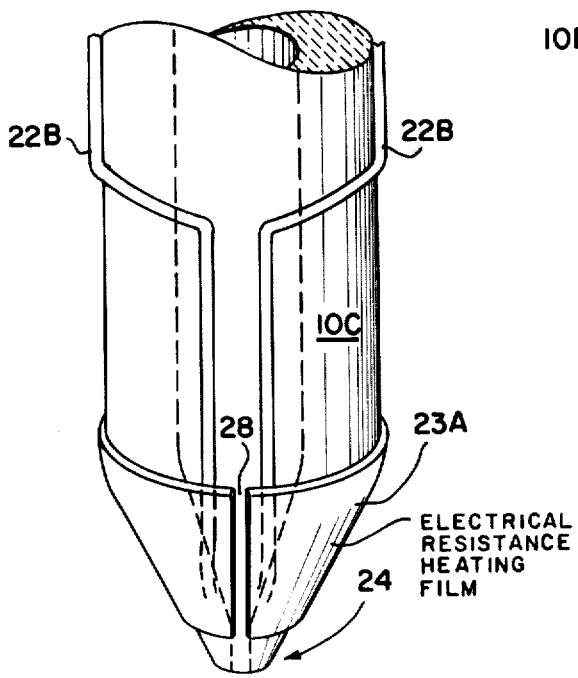
FIG. 6 is an elevation of a portion of another modified embodiment bonding tool.

FIG. 6 shows another modified bonding tool 10C. The conical shape electrically conductive-resistive film 23A is provided with a slot or bare space 28. Conductive pads or paths 22B extend under film 23A. The current path through film 23A is now greater than 180° of circumference. The shortest path is at or near the point of the working tip portion 24 as in previous embodiments. The resistance path being shorter near the lower tip causes greater current density near the working tip and in turn causes greater heating effect where it is desired and needed. It will be noted that the resistance monitor employed for temperature indications will require a different calibration from previously discussed embodiments.

Figure 7:
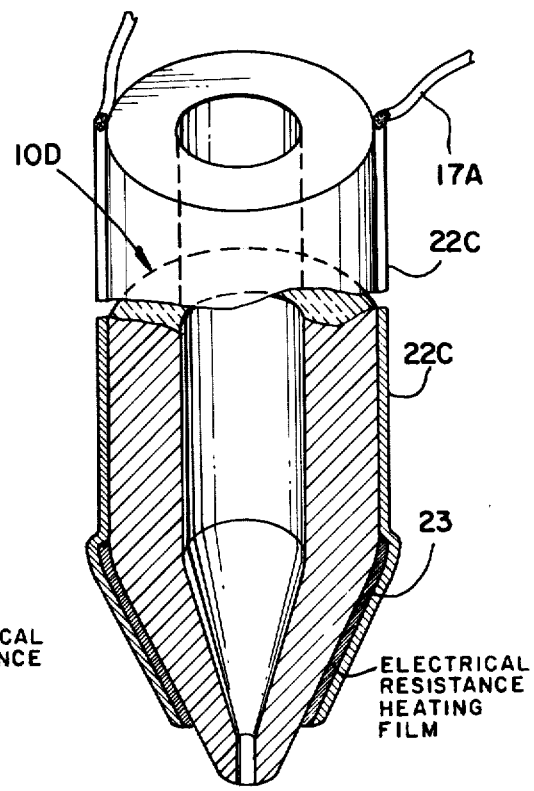
FIG. 7 is an elevation of a portion of another modified embodiment bonding tool showing permanently attached flexible power leads.

FIG. 7 shows another modified embodiment heated bonding tool 10D. The electrically conductive-resistive film 23 is first deposited on the base capillary 10D and the terminal paths are applied on the outside of the resistive film 23. When the film 23 is fired at very high temperatures, the gold paste need not be subject to the same high temperatures since it may be added in a secondary step. The electrical characteristics of the heated bonding tools shown in FIGS. 3 to 5 are the same as FIG. 7. FIG. 7 shows a further modification in that flexible leads 17A may be permanently attached to the conductive pads 22C. Parallel gap welding will attach the flexible copper conductors 17A to gold terminal pads 22C. When permanent leads 17A are attached to heating bonded tool 10D at the top of the tool, the tool may be inserted into a tool holder 11 from the top, accordingly, the tool is made long enough to extend above the bonding tool holder 11. The same flexible leads 17A may be attached at a point which is intermediate the ends of tool 10D in which event, it is preferred to terminate pads 22 at the leads 17A so they will not interfere with holder 11.

Figure 8:
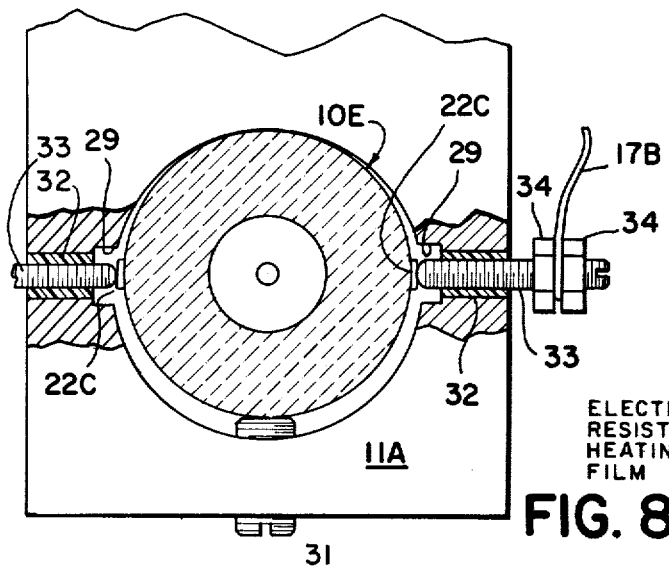
FIG. 8 is a plan view of a modified tool holder showing alternative ways of attaching power leads.

FIG. 8 is a plan or top view of a heated bonding tool 10E similar to tool 10D which is mounted in a bonding tool holder 11A. The conductive terminal pads 22C may extend completely through tool holder 11A because slotted aperatures 29 provide air insulation gaps between pads 22C and holder 11A. The heated bonding tool 10E is first clamped in place by screw 31 threaded through holder 11A. It will be noted that tool holder 11A is caapable of holding any of the aforementioned tools 10 to 10E. In some environmental conditions it may be desirable to provide a pressure contact point on one or more sides of tool 10E. Accordingly, an insulating sleeve 32 is fixed in tool mount 11A. A conductive threaded screw is shown mounted in the threaded sleeve 32 and is adjusted to engage a pad 22C on one side of bonding tool 10E. The pad 22C on the other side of the bonding tool may be engaged by a similar conductive threaded screw 33 or by terminal leads 17A described hereinbefore. A flexible lead 17B is attached to screw 33 and preferably held in place by lock nuts 34 which are threaded on screw 33. Other known spring urged devices may be employed in lieu of threaded screw 33.

Figure 9:
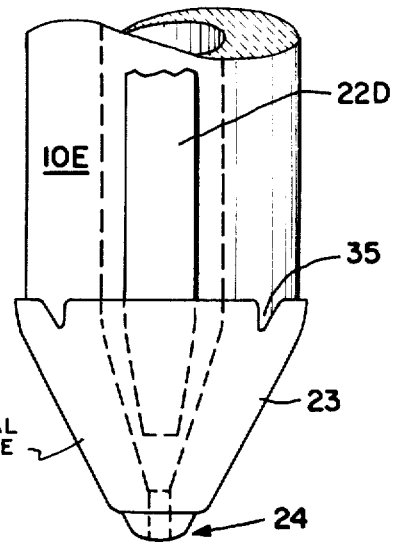
FIG. 9 is an elevation of a portion of a modified bonding tool of the type shown in FIGS. 1 to 3.

FIG. 9 is a heated bonding tool similar to previously described tools. Pad 22D is shown wider than the previously described pads 22 to illustrate that the lower end which extends under film 23 may be tapered to produce a more uniform voltage gradient through film 23.

It has been determined that the resistance of film 23 can easily be duplicated under mass production conditions within fifteen percent (15%). Cutting back or trimming the top or even the bottom of the conical shape film 23 is a preferred method of adjusting the resistance. Notches such as notch 35 are also a preferred way of adjusting the resistance of the film 23 after it is fired and hardened.

Figure 11:
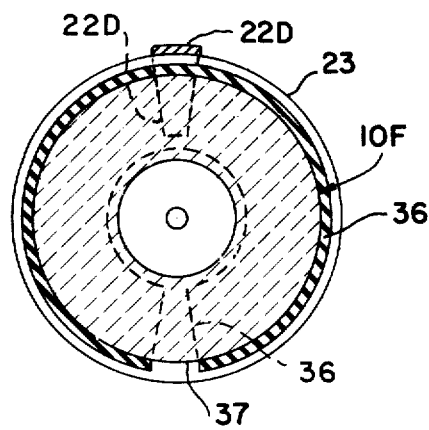
FIG. 11 is a section in plan view taken at lines 11—11 of FIG. 10.
Figure 10:
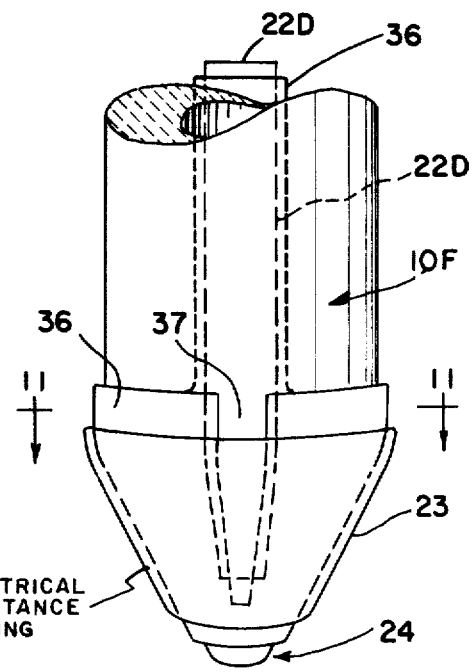
FIG. 10 is an elevation of a portion of another modified bonding tool.

FIGS. 10 and 11 show a modified bonding tool 10F. The nib or capillary is made of conductive material such as tungsten, tungsten carbide or hard sintered powdered metals. An insulating layer 36 is deposited over the conductive metal tool capillary 10F at the working tip portion 24. The insulating layer 36 is provided with a bare space or slot 37 which exposes part of the working tip portion 24. When the conductive-resistive film 23 is applied over layer 36, the film 23 engages in electrical contact with the portion 24 exposed by slot 37. As best shown in FIG. 10, the bonding tool capillary may be employed as a terminal pad which connects to film 23 at slot 37. Terminal pad 22D on the other side opposite the slot 37 may serve as a second terminal pad. It will now be understood that applying an insulative layer 36 over any metal conductive tool of any shape will render the conductive tool the same as a completely insulative ceramic tool. Further, the insulative layer 36 can be placed on a conductive tool 10F of any shape to form complete insulative underlayment for pads 22 and film 23.

Figure 12:
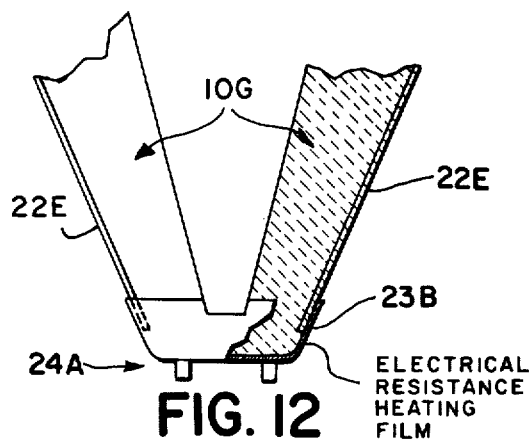
FIG. 12 is a partial elevation of another shape of bonding tool to which the novel heater is applied.

FIG. 12 shows another modified bonding tool 10G. Bonding tools of the shape shown may be used for beam lead bonding or for inner lead and outer lead bonding of foil patterns. In the embodiment shown, the tool 10G is of a shape which is similar to those known in the prior art and have been employed with pulse energy. The conductive terminal pads 22E are similar to pads 22 of FIG. 3. Film 23B is deposited on the sides of the tool 10G to complete the circuit therebetween. When the bonding tool base 10G is of a conductive material it may be desired to deposit an insulative underlayment under the pads 22E and film 23B. In operation, the current passing through the film 23B heats only the working tip 24A. The film 23B may be made for high temperature compositions which easily withstand high temperatures. This will permit the base or body to be made of any type of material which was really not feasible with the prior art bonding tools of similar shape.

When making the aforementioned heated bonding tools it was discovered that numerous alternative steps could be employed to produce the structures shown. When carbide capillaries were used they were cleaned and dried just prior to the application of the composite thick film pastes. Spinning the capillary during application of the paste results in a more uniform coating. Drying the composite paste before firing the composite paste in a belt furnace produces more uniform layers and avoids the possibility of undesirable flow of the paste. The manner in which the pastes are thinned and-/or applied is generally known and will not be described herein.

Having explained several preferred heated bonding tools, all of which employ a deposited paste conductive-resistive film it will be understood that other types of films and other methods of depositing the films and pads may be employed to produce the same novel heated bonding tools. The variations and modifications described hereinbefore are intended to illustrate the numerous ways in which the films may be connected to sources of power and the current conducted through a heating film. The features of the different figures were intended to provide features which could be interchanged. As an example, any of the basic film structures can be applied to either a conductive or a non-conductive wire bonding capillary, die bonding tool or multi-lead bonding tool. Further, any of the film heaters may be heated by pulse energy or continuous energy as the circumstances may require.

We claim:

1. A heated bonding tool for the manufacture of semiconductor devices comprising:
   a high density non-porous alumina electrically insulating bonding tool, said bonding tool including a mounting portion at one end, a working portion at the other end and a tapered portion converging toward said working tip portion, the outer surface of said bonding tool being electrically insulative,
   an electrically conductive-resistive thick film deposited over said outer surface of said tapered portion of said bonding tool intermediate said mounting portion and said working tip portion leaving said working tip exposed,
   said thick film being capable of heating said exposed working tip of said bonding tool up to 600° C. when an electrical current is passed through said conductive-resistive thick film,
   said thick film consisting of a matrix of conductive-resistive material,
   a pair of thick film contact terminal pads deposited on said outer surface of said mounting portion and forming a continuation of said conductive-resistive thick film for connecting said conductive-resistive thick film to a source of electrical current, and
   said thick film contact terminal pads being adapted to be connected to said source of electrical current.

2. A heated bonding tool as set forth in claim 1 wherein said electrically conductive-resistive film is provided with a bare space portion, and said contact terminal pads are connected to said film adjacent to said bare space portion, the electrical current path through said film being greater than 180 degrees of the circumference of said bonding tool.

3. A heated bonding tool as set forth in claim 1 which further includes
   an insulative coating over said electrically conductive-resistive film, and
   a highly reflective layer over said insulative coating.

4. A heated bonding tool as set forth in claim 3 wherein said reflective layer is electrically conductive and has a low coefficient of emissivity.

5. A heated bonding tool as set forth in claim 1 wherein the material forming said electrically conductive-resistive thick film has a high negative temperature coefficient of resistance and reduces in resistance with an increase in temperature, whereby, the measured resistance of said film is an indication of the temperature of said working tip.

6. A heated bonding tool as set forth in claim 1 wherein the material forming said electrically conductive-resistive thick film has a high positive temperature coefficient of resistance and increases in resistance with an increase in temperature, whereby the resistance of said film is an indication of the temperature of said working tip.

7. A heated bonding tool for the manufacture of semiconductor devices comprising:
   an electrically insulated bonding tool, said bonding tool including a mounting portion at one end and a working tip portion at the other end, at least the outer surface of said bonding tool being electrically insulative,
   an electrically conductive-resistive film deposited on the outer surface of said bonding tool intermediate said mounting portion and said working tip portion, said film being adapted to heat said working tip of said bonding tool when said electrical current is passed through said conductive-resistive film,
   contact terminal pads on said bonding tool connected to said conductive-resistive film for connecting said film to a source of electrical current,
   a bonding tool holder for supporting said bonding tool by said mounting portion, an insulative lead support, a pair of electrical leads mounted on said insulative lead support, and flexible terminal portions extending from said electrical leads for engaging said contact terminal pads on said bonding tool and for connecting said electrically conductive-resistive film to a source of electrical current, said flexible terminal portions comprising resilient members spring biased to engage said contact terminal pads on said bonding tool.

8. A heated bonding tool as set forth in claim 7 which further includes a cam rotatably mounted on said lead support between said flexible terminal portions, said cam being adapted to simultaneous engage said flexible terminal portions and being rotatable to disengage them from said contact terminal pads.

9. A heated bonding tool for the manufacture of semiconductor devices comprising:

a high density non-porous alumina electrically insulated bonding tool, said bonding tool including a mounting portion at one end, a working tip portion at the other end and a tapered portion converging toward said working tip portion, an electrically conductive-resistive thick film deposited over said outer surface of said tapered portion of said bonding tool intermediate said mounting portion and said working tip portion, said thick film being adapted to heat said working tip of said bonding tool when an electrical current is passed through said conductive-resistive film, a pair of thick film contact terminal pads deposited on the outer surface of said mounting portion and forming a continuation of said conductive-resistive thick film for connecting said conductive-resistive thick film to a source of electrical current, a pair of conductive electrical leads adapted to be connected to a source of electrical current mounted on an insulative lead support and being provided with flexible terminal portions extending from said insulative lead support, said flexible terminal portions being engaged with said thick film contact terminal pads with a spring bias force, and a holder for supporting said bonding tool by said mounting portion.

10. A heated bonding tool as set forth in claim 9 wherein said conductive electrical leads are resilient and are spring biased at said flexible terminal portions to engage said thick film contact terminal pads.

11. A heated bonding tool as set forth in claim 10 which further includes cam means rotatably mounted on said insulative lead support, said cam being adapted to engage said flexible terminal portions and being rotatable to disengage said terminal portions of said electrical leads from said contact terminal pads.

* * * * *